US012412984B2

(12) United States Patent
Lin

(10) Patent No.: US 12,412,984 B2
(45) Date of Patent: Sep. 9, 2025

(54) ANTENNA APPARATUS WITH FLOATING PATCH

(71) Applicant: MILLILAB CO., LTD., Hsinchu (TW)

(72) Inventor: Hung-Hsuan Lin, Hsinchu (TW)

(73) Assignee: MILLILAB CO., LTD., Hsinchu (TW)

( * ) Notice: Subject to any disclaimer, the term of this patent is extended or adjusted under 35 U.S.C. 154(b) by 94 days.

(21) Appl. No.: 18/435,348

(22) Filed: Feb. 7, 2024

(65) Prior Publication Data

US 2025/0253533 A1 Aug. 7, 2025

(51) Int. Cl.
*H01Q 9/04* (2006.01)
*H05K 1/02* (2006.01)

(52) U.S. Cl.
CPC ......... *H01Q 9/0414* (2013.01); *H05K 1/0243* (2013.01); *H05K 2201/10098* (2013.01)

(58) Field of Classification Search
CPC ............... H01Q 9/0414; H05K 1/0243; H05K 2201/10098
See application file for complete search history.

(56) References Cited

U.S. PATENT DOCUMENTS

2019/0333882 A1* 10/2019 Kamgaing ........ H01L 23/49827

\* cited by examiner

*Primary Examiner* — Jimmy T Vu
(74) *Attorney, Agent, or Firm* — Chun-Ming Shih; HDLS IPR SERVICES

(57) ABSTRACT

An antenna apparatus includes a multi-layer printed circuit board, an antenna, and a floating patch group. The multi-layer printed circuit board includes a first metal layer, a first dielectric layer, a second metal layer, a second dielectric layer, and a third metal layer. The antenna is formed from at least one of the first metal layer, the second metal layer, and the third metal layer. The floating patch group is located in the multi-layer printed circuit board and includes a plurality of floating patches. The floating patch has a width. There is a gap between the floating patch and an adjacent floating patch. The floating patches have the same or similar width and the same or similar gap. The floating patch group is arranged in a metal layer where the antenna is located. There is a spacing between the floating patch group and the antenna.

6 Claims, 15 Drawing Sheets

ANTENNA APPARATUS WITH FLOATING PATCH

BACKGROUND OF THE DISCLOSURE

Technical Field

The present disclosure relates to an antenna apparatus, and especially relates to an antenna apparatus with floating patches.

Description of Related Art

At present, most of the antennas in the millimeter wave frequency band used for the civilian purposes use single-layer or multi-layer low-loss circuit boards with the planar antenna designs (such as patch antennas) to achieve the low cost and the acceptable radio frequency characteristics. In some applications, in order to obtain better antenna radiation characteristics (such as wider bandwidth, high gain, and high efficiency), thicker dielectric substrates or multi-layer substrates are used to manufacture the antenna structures. In the related art designs, in order to avoid the interference with the antenna structure or the distortion of the radiation field pattern, there must be a sufficiently large setback clearance area between the antenna structure and the copper foil (or other metal structures).

The antenna body and its corresponding clearance area are collectively called the antenna area, which is a special area that needs to be handled carefully in the layout of multi-layer printed circuit boards. Due to the characteristics of patch antennas, the copper foil factor in the antenna area is quite low, which causes a lot of negative effects on the printed circuit board structure, including the deformation and warping of the printed circuit board due to asymmetric or uneven copper foil distribution, blistering due to pores caused by excessive filling volume of the prepreg layer, and reduced heat dissipation performance due to less surface metal.

FIG. 1 shows a schematic diagram of the related art broadband stacked patch array antenna structure. FIG. 2 shows a cross-sectional view of the related art broadband stacked patch array antenna structure. The related art wideband stacked patch array antenna structure is made of a multi-layer printed circuit board; this is an antenna design related to the millimeter wave frequency band. As shown in FIG. 1, multiple antenna units 108 are densely arranged in a two-dimensional and equally spaced manner. The arrangement period P of the antenna units 108 is usually less than the half-wavelength corresponding to the highest operating frequency to avoid the generation of the grating lobes. In the same metal layer, there is a gap S1 between a patch and an adjacent patch.

As shown in FIG. 2, the printed circuit board used in the related art stacked patch array antenna structure includes, for example but not limited to, a first metal layer m1, a first dielectric layer d1, a second layer m20, a second dielectric layer d2, a third metal layer m3, a third dielectric layer d3, and a fourth metal layer m4. A main patch 1044 connected to a radio frequency feeder (not shown in FIG. 2) is arranged in the third metal layer m3. A parasitic patch 1046 is arranged in the first metal layer m1. An antenna ground plane 1048 is arranged in the fourth metal layer m4. The size of the parasitic patch 1046 is similar with the size of the main patch 1044 so that the parasitic patch 1046 and the main patch 1044 are coupled to each other to increase the bandwidth.

However, in the antenna units 108 shown in FIG. 1, the copper foil filling factor of each metal layer is actually not high. Taking FIG. 1 and FIG. 2 as an example, in the first metal layer m1 and the third metal layer m3 where the parasitic patch 1046 and the main patch 1044 are located, the copper foil filling factor in each of the antenna units 108 is approximately less than 30%; the copper foil filling factor of the second layer m20 which is used as the interval is 0%; the copper foil filling factor of the fourth metal layer m4 where the antenna ground plane 1048 is located is 95%. The extremely asymmetric and uneven copper foil filling factors cause a lot of problems, including the thermal deformation and warping caused by heating and cooling in the subsequent processes, the displacement of the copper foil, and the blistering caused by the prepreg layer (namely, the second dielectric layer d2 in this case) due to incomplete resin filling, and so on.

Designers may use the following several methods to avoid the above problems. The first method is to change the type of the antenna, such as using a slot antenna which has a higher copper foil filling factor. However, different antenna designs will have different field pattern, bandwidth, and other characteristics; the thickness of the stacked layers and the forms of the through holes may also be different; therefore, changing the type of antenna is usually very difficult.

The second method is to add some auxiliary metal structures to reduce the blank area to increase the filling factor. One of the designs is shown in FIG. 3. FIG. 3 shows a schematic diagram of the related art broadband stacked patch array antenna structure adding the side wall structure. A closed metal side wall MSW is added to the boundary of each layer of each of the antenna units 108; the metal side walls MSW of each layer are connected through a plurality of through holes h1.

Although this design with the closed metal side walls MSW may increase the isolation of adjacent antenna units 108 and suppress lateral propagation modes, the spacing S2 between the metal side wall MSW and the parasitic patch (and the main patch) may not be too small. If the spacing S2 is too small, the resonance mode of the parasitic patch and the main patch is affected, and the bandwidth is reduced; therefore, in practice, the width WF of the metal side wall MSW must be very narrow. Therefore, the metal side wall MSW adds a very small copper foil filling factor to the antenna unit 108.

The third method is to add multiple electromagnetic band-gap (commonly referred to as EBG) units around the patch. FIG. 4 shows a schematic diagram of the related art series fed patch array antenna structure adding a plurality of electromagnetic band-gap structures 110. Electromagnetic band-gaps are periodically arranged structures that block lateral propagation modes, reduce the antenna side/back lobes, and reduce coupling between adjacent antenna units. The most commonly used in printed circuit board structures is the mushroom-shaped electromagnetic band-gap structure 110, which is a small piece of metal with a grounding through hole h2 in the center; a small gap is between adjacent electromagnetic band-gap structures 110.

However, for the millimeter wave frequency band, using the printed circuit board manufacturing process to produce the electromagnetic band-gap is very difficult. Firstly, the grounding through hole h2 is not a perfect cylinder and has respective difference, which results in the ground inductance value not being accurately controlled. Secondly, the small gap between the small piece structure and the adjacent small piece structure causes the edge coupling; since the process control of the copper etching of the printed circuit board is limited, the edge profile is trapezoidal and uneven. Based on the above two reasons, for the millimeter wave frequency band, the band-gap characteristics are difficult to be controlled when the electromagnetic band-gap is produced, and even the characteristics in the target frequency band becomes completely opposite due to the resonance frequency drift. In addition, the electromagnetic band-gap structure has requirements and restrictions on the thickness of the board; producing the electromagnetic band-gap structure in the thick substrate or the multi-layer printed circuit board is difficult and not easy.

Although the metal side walls and the electromagnetic band-gap structures have their own functions, neither the metal side walls nor the electromagnetic band-gap structures may be close to the main patch and the parasitic patch. There are limitations and difficulties in filling the clearance area of the patch antenna with the metal side walls or the electromagnetic band-gap structures to increase the copper foil filling factor. Especially, producing the electromagnetic band-gap structure in the application of the multi-layer printed circuit board is very difficult.

SUMMARY OF THE DISCLOSURE

In order to solve the problems mentioned above, the object of the present disclosure is to provide an antenna apparatus with floating patches.

In order to achieve the object of the present disclosure mentioned above, the antenna apparatus of the present disclosure includes a multi-layer printed circuit board, an antenna, and a floating patch group. The multi-layer printed circuit board includes a first metal layer, a first dielectric layer, a second metal layer, a second dielectric layer, and a third metal layer, wherein the first dielectric layer is arranged between the first metal layer and the second metal layer, and the second dielectric layer is arranged between the second metal layer and the third metal layer. The antenna is located in the multi-layer printed circuit board and includes an electromagnetic resonance structure, wherein the antenna is formed from at least one of the first metal layer, the second metal layer, and the third metal layer; the antenna has an operating frequency. The floating patch group is located in the multi-layer printed circuit board and includes a plurality of floating patches, wherein the floating patch has a width, and there is a gap between the floating patch and an adjacent floating patch, and the floating patches have same or similar width and same or similar gap, and the floating patch group is arranged in a metal layer where the antenna is located, and there is a spacing between the floating patch group and the antenna on a plane.

Moreover, in an embodiment of the antenna apparatus of the present disclosure mentioned above, the antenna is a series fed patch array antenna.

Moreover, in an embodiment of the antenna apparatus of the present disclosure mentioned above, the electromagnetic resonance structure includes a main patch and a parasitic patch; the main patch is formed from the first metal layer, the second metal layer, or the third metal layer; the parasitic patch is formed from the first metal layer, the second metal layer, or the third metal layer; the main patch and the parasitic patch are separated by at least one of the first dielectric layer and the second dielectric layer; the floating patch group is arranged in the metal layer where the main patch and the parasitic patch are located.

Moreover, in an embodiment of the antenna apparatus of the present disclosure mentioned above, the parasitic patch is located in the first metal layer; the main patch is located in the third metal layer; the floating patch group is arranged in the first metal layer, the second metal layer, and the third metal layer.

Moreover, in an embodiment of the antenna apparatus of the present disclosure mentioned above, the width of the floating patch is less than one-eighth of a wavelength corresponding to the operating frequency of the antenna in a vacuum environment.

Moreover, in an embodiment of the antenna apparatus of the present disclosure mentioned above, the spacing is less than one-fifth of a wavelength corresponding to the operating frequency of the antenna in a vacuum environment.

The advantage of the present disclosure is to prevent the deformation, warping, and blistering of the multi-layer printed circuit board, and to improve the heat dissipation performance of the multi-layer printed circuit board.

Please refer to the detailed descriptions and figures of the present disclosure mentioned below for further understanding technologies, methods, and effects and achieving the predetermined purposes of the present disclosure. Further, the purposes, characteristics, and features of the present disclosure may be more deeply and specifically understood. However, the drawings are provided only for references and descriptions and not intended to limit the scope of the present disclosure.

DETAILED DESCRIPTION

In the present disclosure, numerous specific details are provided, to provide a comprehensive understanding of embodiments of the present disclosure. However, those skilled in the art may understand that the present disclosure may be practiced without one or more of these specific details. In other instances, well-known details are not shown or described to avoid obscuring features of the present disclosure. The technical content and the detailed description of the present disclosure are as follows with reference to the figures.

The present disclosure is designed based on the multi-layer printed circuit board structure. The multi-layer printed circuit board structure may sequentially include, for example, a first metal layer, a first dielectric layer, a second metal layer, a second dielectric layer, a third metal layer (and so on) from top to bottom. A commonly used stacked structure includes, for example, four-layer metal layers (wherein the multi-layer printed circuit board includes three dielectric layers), six-layer metal layers (wherein the multi-layer printed circuit board includes five dielectric layers), and so on. The present disclosure uses a lot of floating ungrounded small patches to fill the clearance area in the antenna unit. The size of the small patch is very small relative to the wavelength corresponding to the operating frequency of the antenna. The resonant frequency of the small patch is much higher than the operating frequency of the antenna, so the small patch is nearly transparent to the mode of the antenna (namely, the small patch hardly affects the mode of the antenna), and the small patch does not have a significant impact on the field pattern of the antenna and the impedance matching. The small floating ungrounded patches may be filled in each layer of the printed circuit board, which may effectively increase the copper foil filling factor and effectively solve the problem of uneven and insufficient copper foil filling of the patch antenna.

Figure 5:
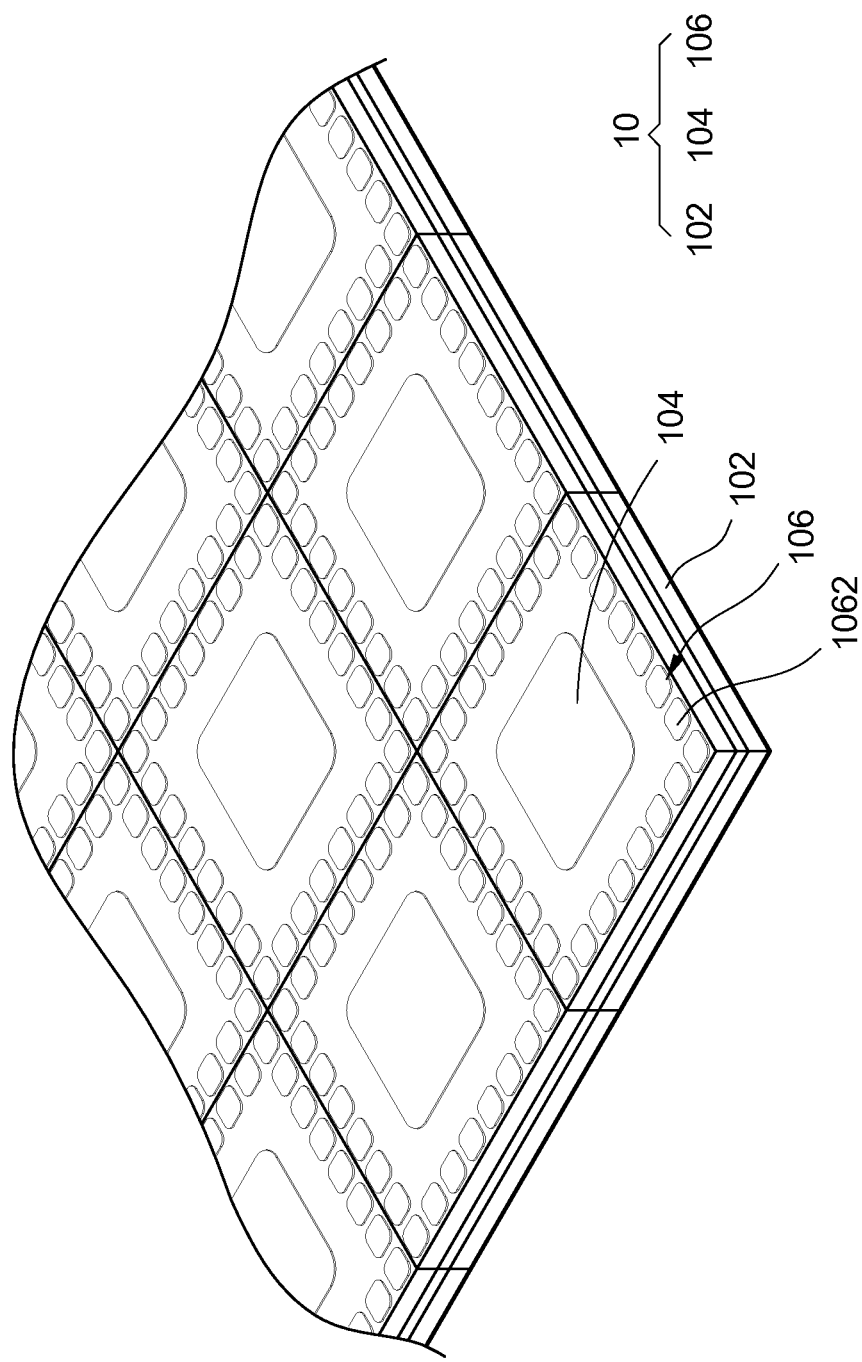
FIG. 5 shows a three-dimensional schematic diagram of the stacked patch array antenna structure (namely, a plurality of antenna apparatuses) that adds the small floating patches according to the first embodiment of the present disclosure.
Figure 5A:
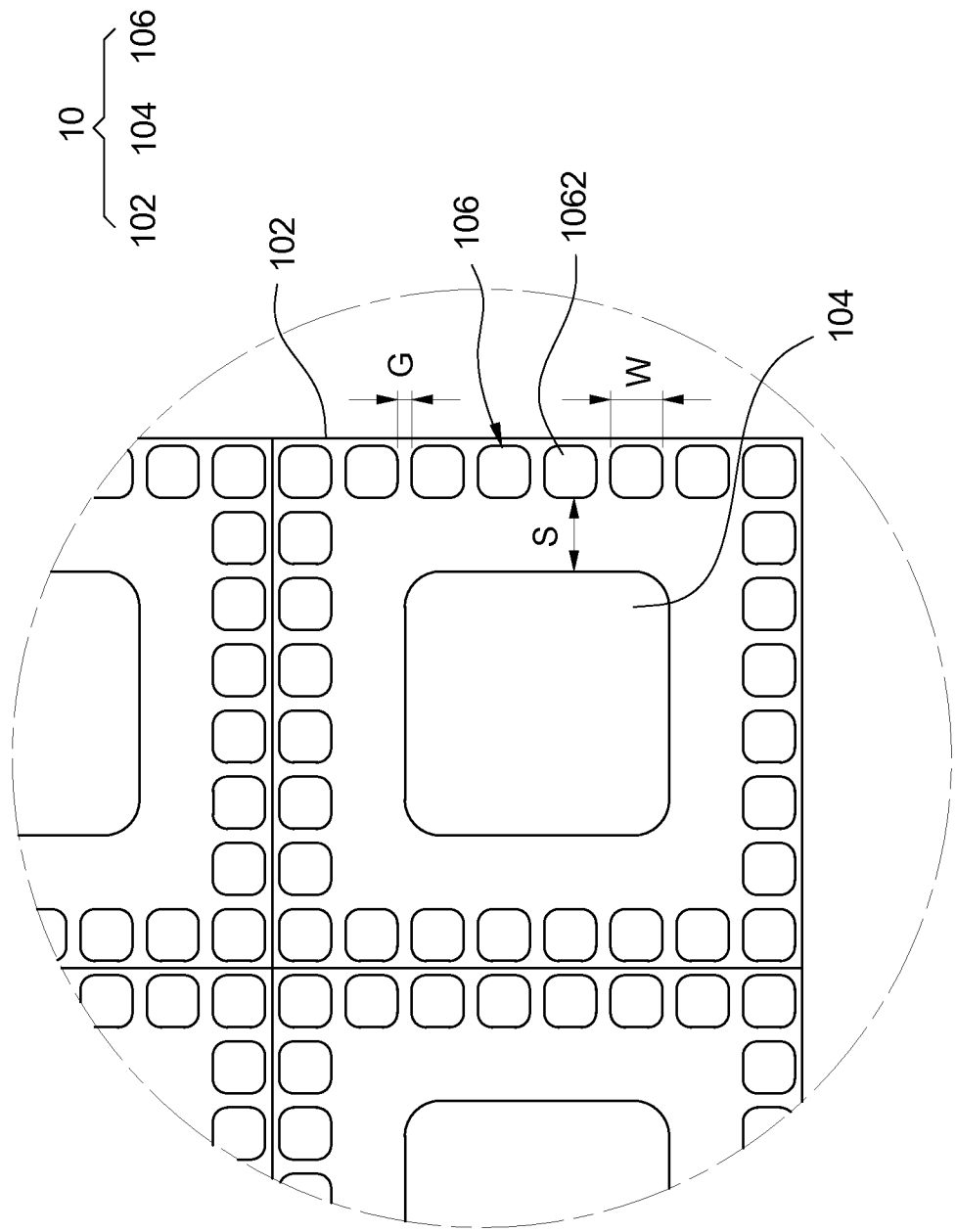
FIG. 5A shows a top view (partial enlargement) of the stacked patch array antenna structure that adds the small floating patches according to the first embodiment of the present disclosure.
Figure 6:
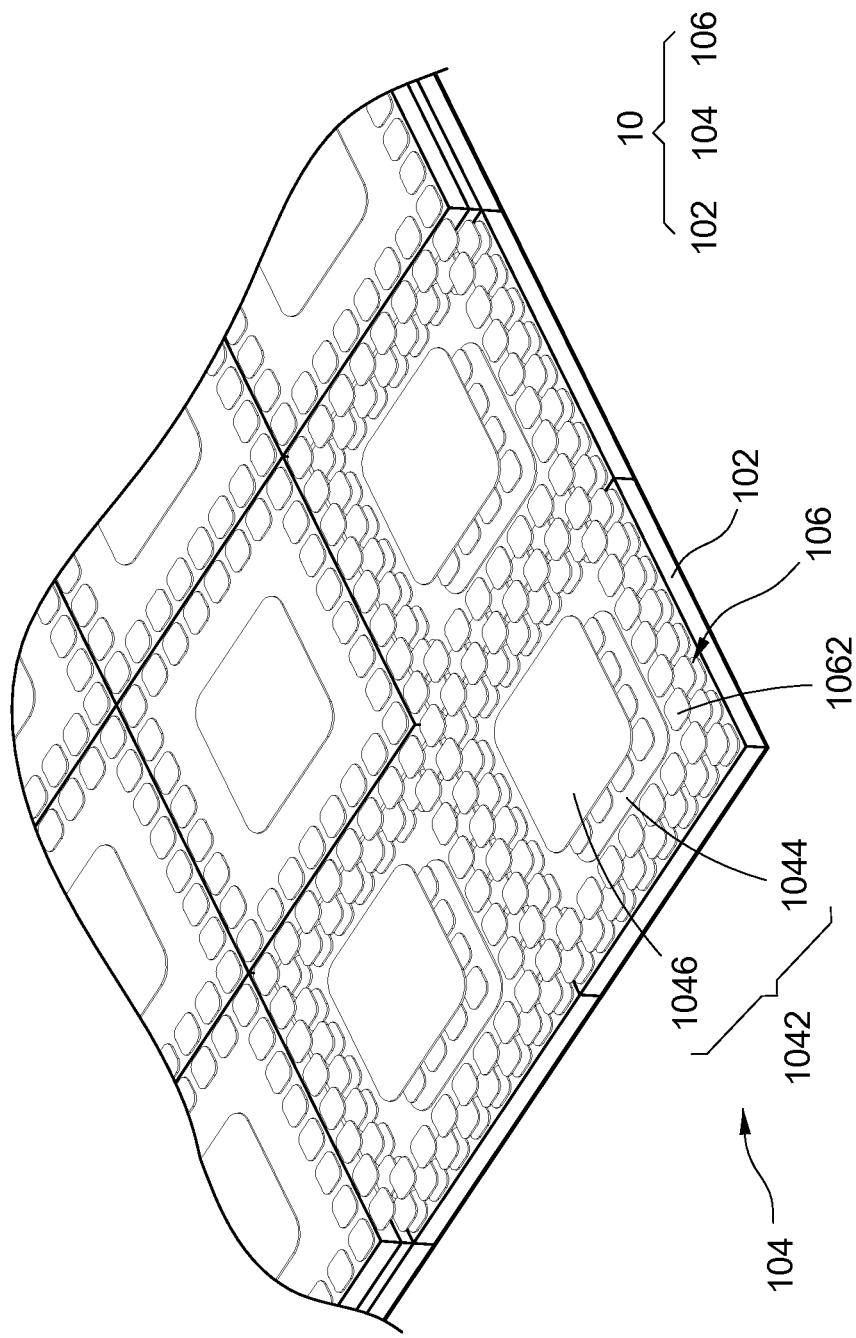
FIG. 6 shows a three-dimensional schematic diagram of the stacked patch array antenna structure that adds the small floating patches according to the first embodiment of the present disclosure, wherein the dielectric layers are not shown in FIG. 6.
Figure 7:
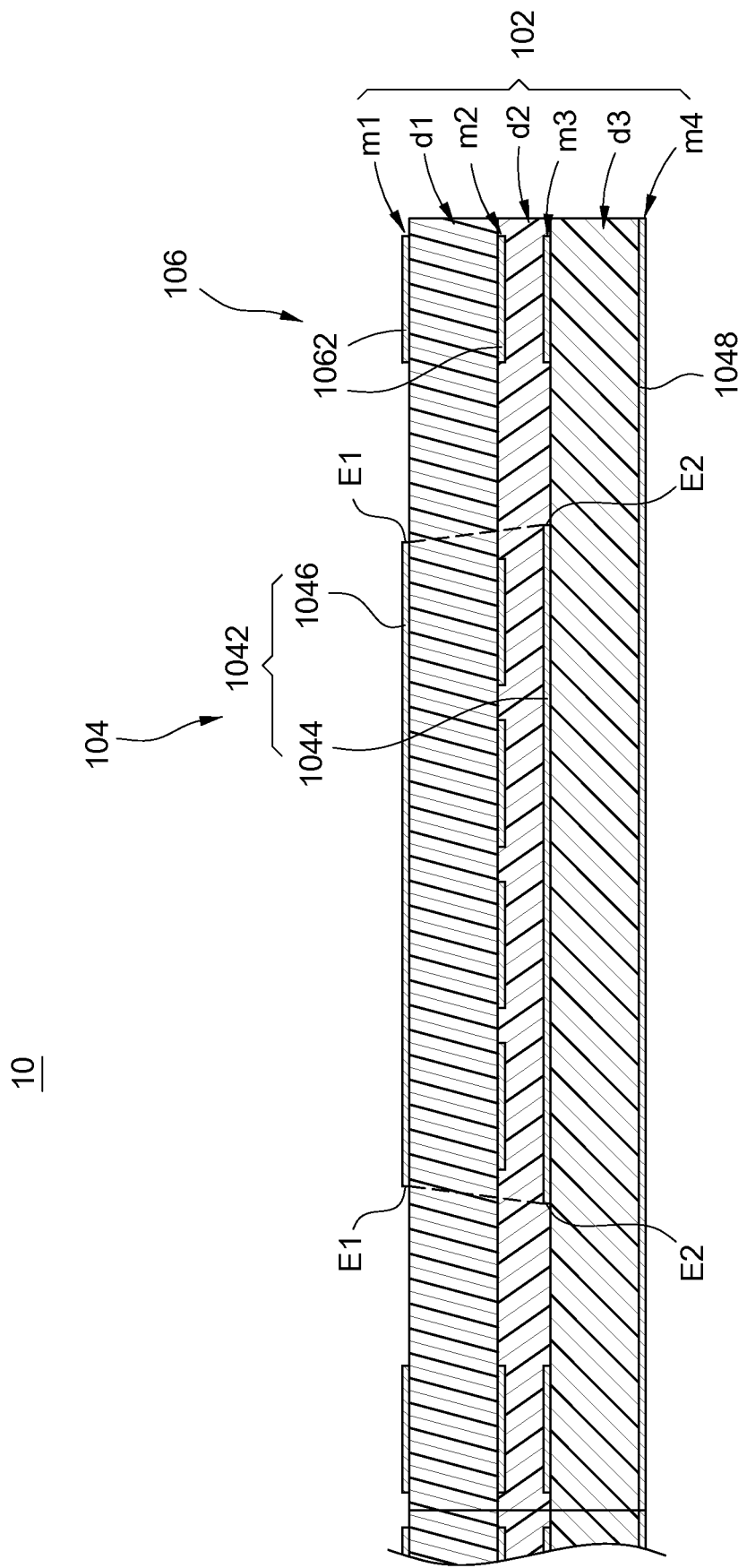
FIG. 7 shows a cross-sectional view of the stacked patch array antenna unit (namely, the antenna apparatus) that adds the small floating patches according to the first embodiment of the present disclosure.

FIG. 5 shows a three-dimensional schematic diagram of the stacked patch array antenna structure (namely, a plurality of antenna apparatuses 10) that adds the small floating patches according to the first embodiment of the present disclosure. FIG. 5A shows a top view (partial enlargement) of the stacked patch array antenna structure that adds the small floating patches according to the first embodiment of the present disclosure. FIG. 6 shows a three-dimensional schematic diagram of the stacked patch array antenna structure that adds the small floating patches according to the first embodiment of the present disclosure, wherein the dielectric layers are not shown in FIG. 6. FIG. 7 shows a cross-sectional view of the stacked patch array antenna unit (namely, the antenna apparatus 10) that adds the small floating patches according to the first embodiment of the present disclosure.

As shown in FIG. 5, the antenna apparatus 10 includes a multi-layer printed circuit board 102, an antenna 104, and a floating patch group 106. The floating patch group 106 includes a plurality of floating patches 1062. As shown in FIG. 5A, the floating patch 1062 has a width W. There is a gap G between the floating patch 1062 and the adjacent floating patches 1062. The floating patches 1062 have the same or similar width W and the gap G. The floating patch group 106 is at least arranged in a metal layer where the antenna 104 is located. There is a spacing S between the floating patch group 106 and the antenna 104 on a plane. The floating patches 1062 are squares of equal size; however, the shapes of the floating patches 1062 may also be circular, triangular, rectangular, hexagonal, or octagonal, and so on, which are convenient for being arranged and filled in the clearance area.

As shown in FIG. 7, the multi-layer printed circuit board 102 includes a first metal layer m1, a first dielectric layer d1, a second metal layer m2, a second dielectric layer d2, a third metal layer m3, a third dielectric layer d3, and a fourth metal layer m4. The first dielectric layer d1 is arranged between the first metal layer m1 and the second metal layer m2. The second dielectric layer d2 is arranged between the second metal layer m2 and the third metal layer m3. The third dielectric layer d3 is arranged between the third metal layer m3 and the fourth metal layer m4. An antenna ground plane 1048 is located in the fourth metal layer m4.

The antenna 104 is located in the multi-layer printed circuit board 102 and includes an electromagnetic resonance structure 1042. The electromagnetic resonance structure 1042 includes a main patch 1044 and a parasitic patch 1046. The antenna 104 is formed from at least one of the first metal layer m1, the second metal layer m2, and the third metal layer m3. The antenna 104 has an operating frequency. The floating patch group 106 is located in the multi-layer printed circuit board 102.

The main patch 1044 is formed from the first metal layer m1, the second metal layer m2, or the third metal layer m3; for example, the main patch 1044 is located in the third metal layer m3. The parasitic patch 1046 is formed from the first metal layer m1, the second metal layer m2, or the third metal layer m3; for example, the parasitic patch 1046 is located in the first metal layer m1. The main patch 1044 and the parasitic patch 1046 are separated by at least one of the first dielectric layer d1 and the second dielectric layer d2; for example, the main patch 1044 and the parasitic patch 1046 are separated by the first dielectric layer d1. The floating patch group 106 is at least arranged in the metal layer where the main patch 1044 and the parasitic patch 1046 are located; for example, the floating patch group 106 may be arranged in the first metal layer m1, the second metal layer m2, and the third metal layer m3.

As shown in FIG. 5A, the antenna apparatus 10 is square; eight of the floating patches 1062 are arranged on each side of the antenna apparatus 10; however, according to the dielectric coefficient of the multi-layer printing circuit board 102, the size of the antenna apparatus 10, and the radiation characteristic requirements of the antenna 104, the number of the floating patches 1062 arranged on each side of the antenna apparatus 10 is an optimal number, which is not limited by the arrangement of this embodiment.

In terms of the coupling characteristics of the electromagnetic waves, the width W of the floating patch 1062 should not exceed 1/10 of the wavelength corresponding to the operating frequency of the antenna; a larger floating patch 1062 generates stronger interactive coupling with the antenna 104 (the main patch 1044), thereby affecting the operating mode of the antenna 104. On the contrary, the floating patches 1062 with the smaller width W may be arranged more randomly without worrying about affecting the original field pattern of the antenna.

In some cases, placing the floating patch 1062 with a width W which is approximately 1/10 of the wavelength corresponding to the operating frequency of the antenna at a specific periphery of the antenna 104 may modify and adjust the field pattern of the antenna, but the process variation and the broadband characteristics need to be evaluated carefully to avoid adverse effects at specific frequency points. The width W of the floating patch 1062 should avoid being larger than one-eighth of the wavelength corresponding to the operating frequency of the antenna to avoid uncontrollable radiation characteristics. Namely, the width W of the floating patch 1062 should be less than or equal to one-eighth of a wavelength corresponding to the operating frequency of the antenna 104 in a vacuum environment.

From the perspective of the printed circuit board manufacturing process, the width W of the floating patch 1062 must be greater than the minimum floating size allowed by the printed circuit board manufacturing process to prevent the floating patch 1062 from being stripped off during the copper foil etching or the subsequent processing, or causing larger production errors. For a printed circuit board with a copper foil thickness of 1 OZ, the width W of the floating patch 1062 may preferably be greater than 0.2 mm. The minimum value of the gap G between the floating patch 1062 and the adjacent floating patch 1062 should not be less than the minimum gap allowed by the printed circuit board manufacturing process. For a printed circuit board with a copper foil thickness of 1 OZ, the minimum value of the gap G between the floating patch 1062 and the adjacent floating patch 1062 is preferably greater than 0.1 mm, while more than 0.15 mm is safer. The general design of the gap G uses a value slightly larger than the minimum allowable gap, while a larger gap reduces the copper foil filling factor.

Figure 1:
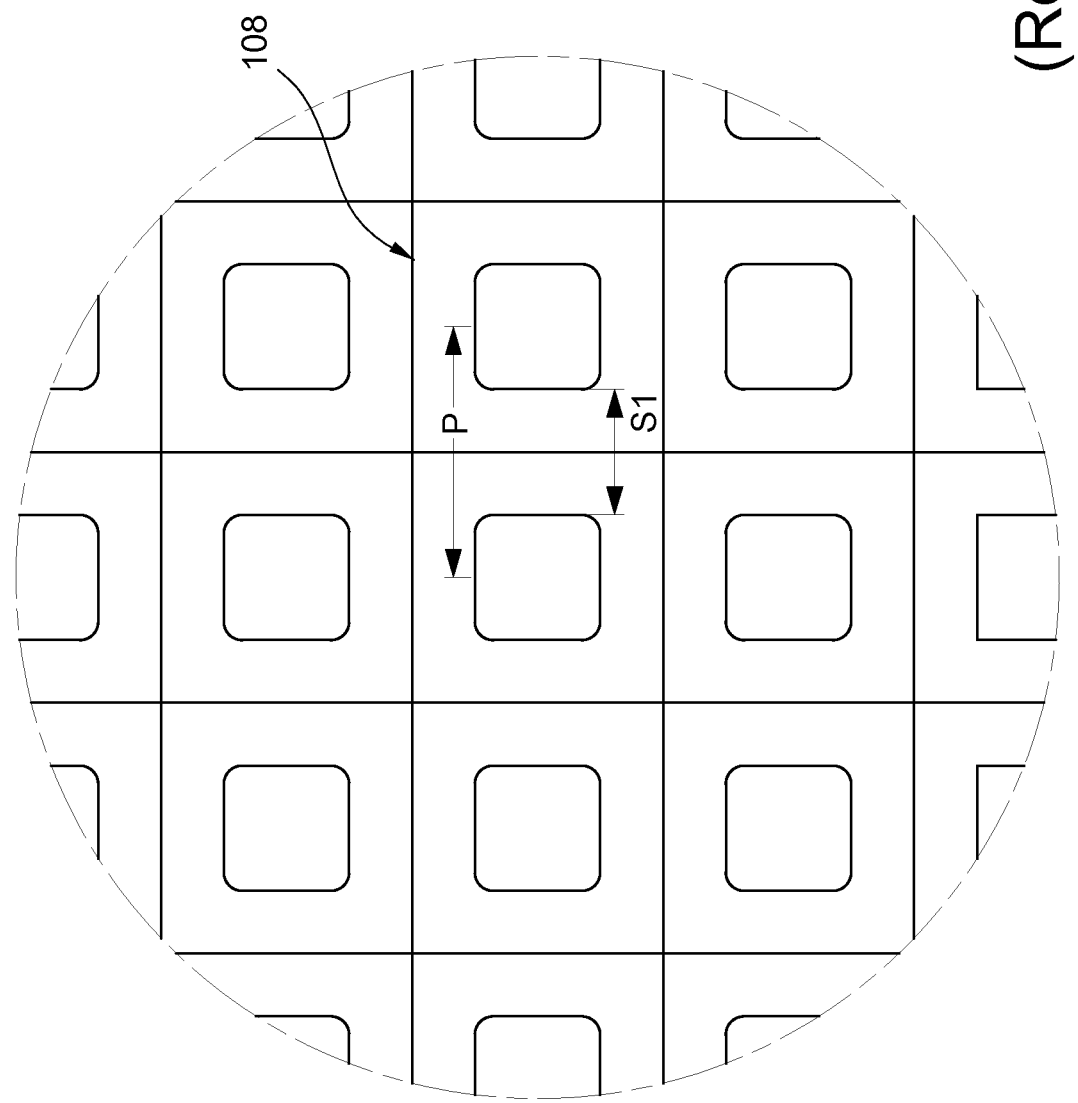
FIG. 1 shows a schematic diagram of the related art broadband stacked patch array antenna structure.
Figure 2:
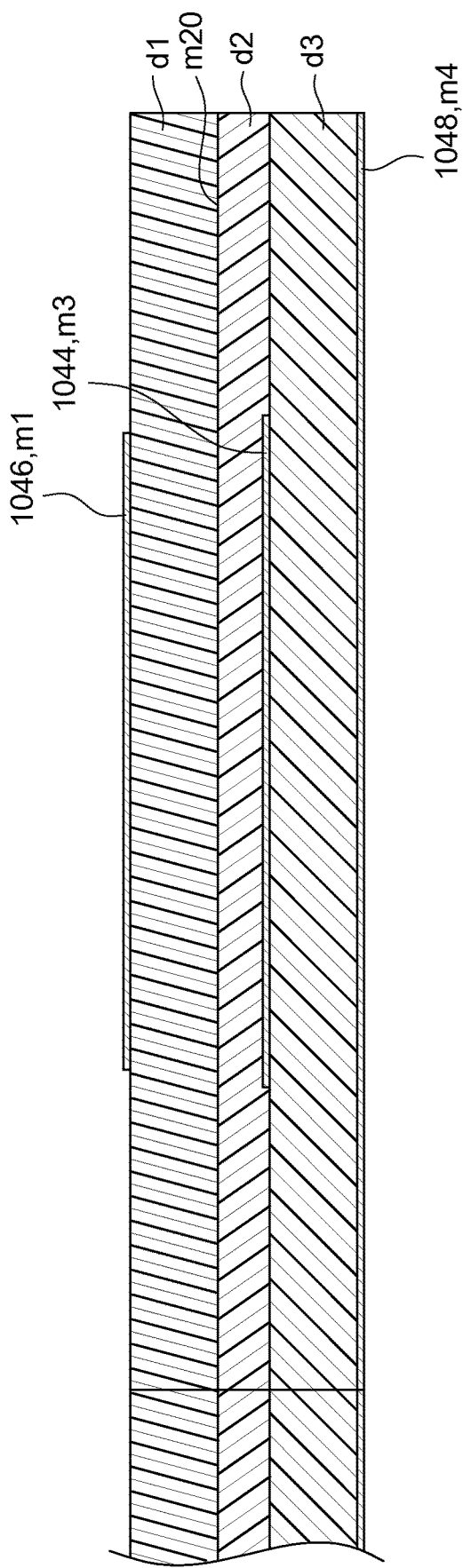
FIG. 2 shows a cross-sectional view of the related art broadband stacked patch array antenna structure.
Figure 3:
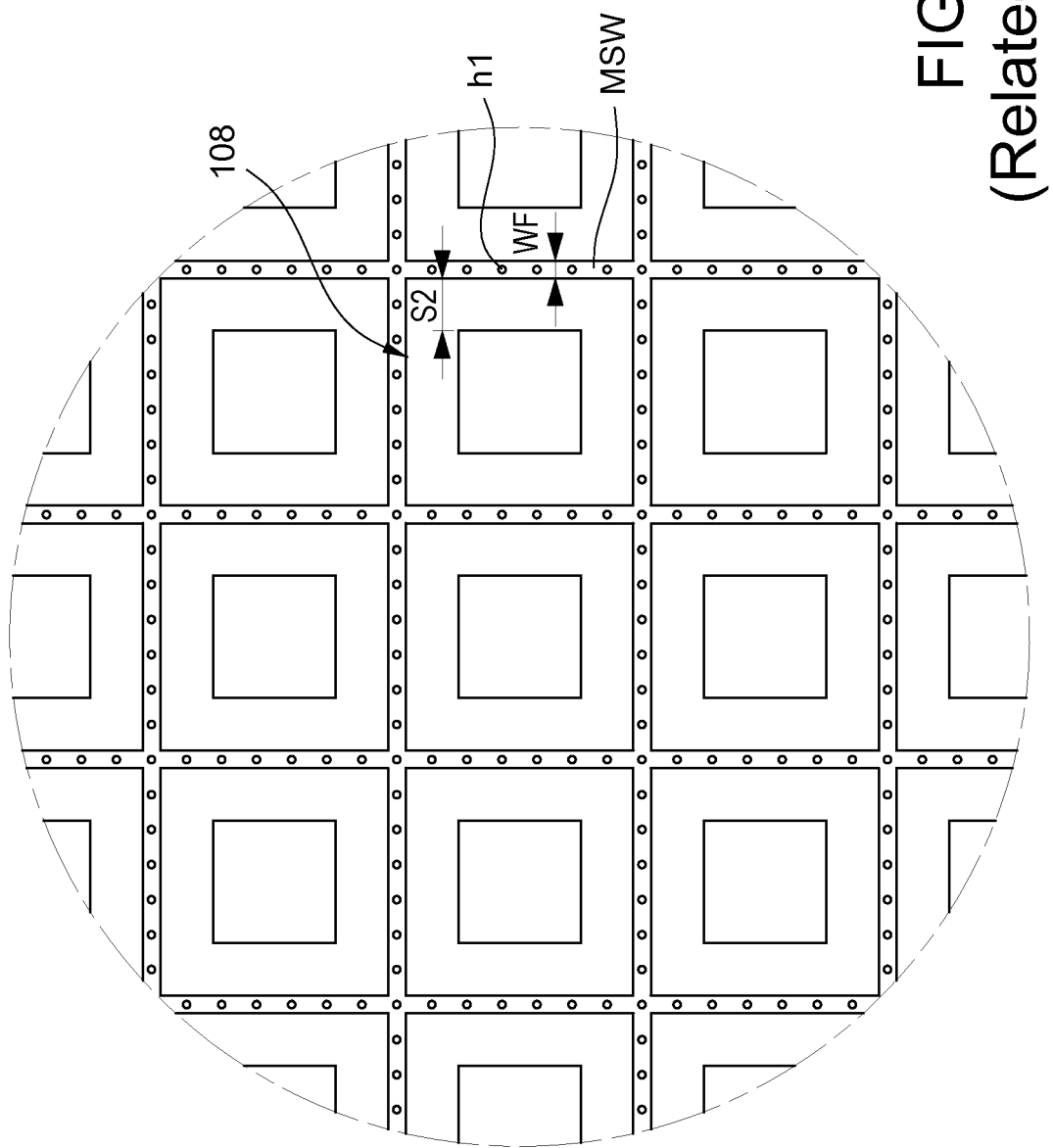
FIG. 3 shows a schematic diagram of the related art broadband stacked patch array antenna structure adding the side wall structure.
Figure 4:
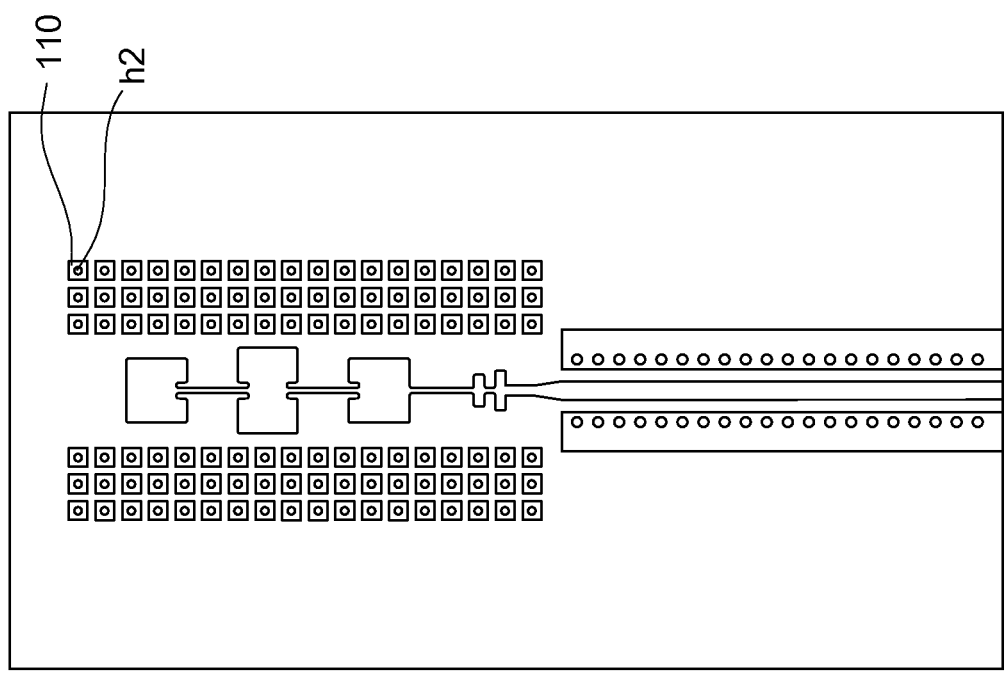
FIG. 4 shows a schematic diagram of the related art series fed patch array antenna structure adding a plurality of electromagnetic band-gap structures.

In the above-mentioned first embodiment of the present disclosure, the beamforming antenna of the satellite receiver is used as the application target, and its operating frequency is 17.7 GHz to 20.2 GHz; if the highest operating frequency 20.2 GHz is used as the criterion, the corresponding wavelength in vacuum is 14.85 mm, the arrangement period P (as shown in FIG. 2) of the antenna apparatuses 10 is 7.42 mm (approximately half of the aforementioned wavelength 14.85 mm), and the width W of the floating patch 1062 is 0.5 mm (approximately 1/30 of the aforementioned wavelength 14.85 mm).

In the above-mentioned first embodiment of the present disclosure, because the floating patches 1062 are also arranged in the second metal layer m2 between the main patch 1044 and the parasitic patch 1046, the width W of the floating patch 1062 should be smaller to reduce the impact on the mode of the antenna 104. The gap G between the floating patch 1062 and the adjacent floating patch 1062 is 0.2 mm (approximately 1/75 of the aforementioned wavelength 14.85 mm). The spacing S between the floating patch 1062 and the main patch 1044 is 0.73 mm (approximately 1/20 of the aforementioned wavelength 14.85 mm).

In the above-mentioned first embodiment of the present disclosure, none of the floating patches 1062 directly contacts the main patch 1044 and the parasitic patch 1046, and none of the floating patches 1062 is too close to the main patch 1044 and the parasitic patch 1046 to avoid affecting the original operation of the antenna 104; therefore, 28 of the floating patches 1062 are respectively arranged in the first metal layer m1 where the parasitic patch 1046 is located and the third metal layer m3 where the main patch 1044 is located, so that the copper foil filling factor of the first metal layer m1 and the third metal layer m3 may be increased from less than 30% to close to 70%.

In the second metal layer m2 which separates the main patch 1044 and the parasitic patch 1046, if the projection-connection blank portions of the floating patches 1062, the edges of the main patch 1044, and the edges of the parasitic patch 1046 are deducted, 16 of the floating patches 1062 may be still arranged between the main patch 1044 and the parasitic patch 1046 based on the principle of not exceeding the edge connections between the main patch 1044 and the parasitic patch 1046. Therefore, a total of 44 of the floating patches 1062 may be arranged in the second metal layer m2, so that the copper foil filling factor of the second metal layer m2 may be increased from 0% to nearly 40% or more. The fourth metal layer m4 maintains the original arrangement of the antenna ground plane 1048; namely, the copper foil filling factor of the fourth metal layer m4 remains unchanged.

The floating patches 1062 are in the same square shape and have the same width W and gap G, so that the floating patches 1062 may be quickly arranged, but the present disclosure is not limited thereto; namely, the present disclosure may use the floating patches 1062 of different shapes or sizes in some areas to further increase the copper foil filling factor. The floating patches 1062 in different layers may be slightly staggered to make the copper foil filling more even.

Figure 8:
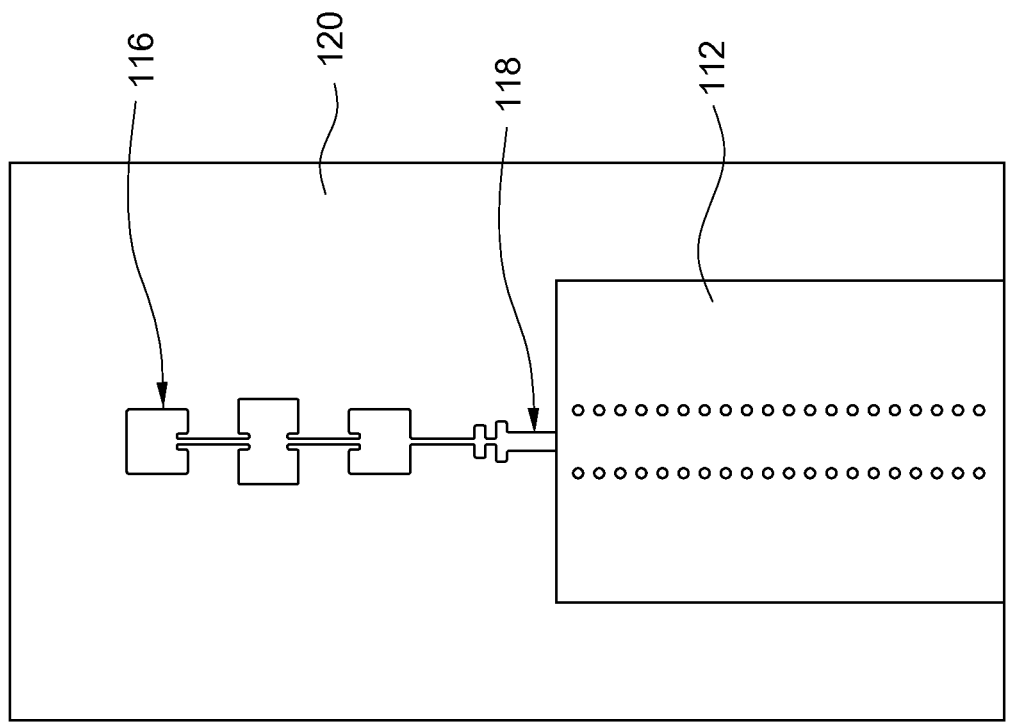
FIG. 8 shows a top view of the related art embedded series fed patch array antenna structure, wherein the dielectric layers and the side ground plane are not shown in FIG. 8.
Figure 9:
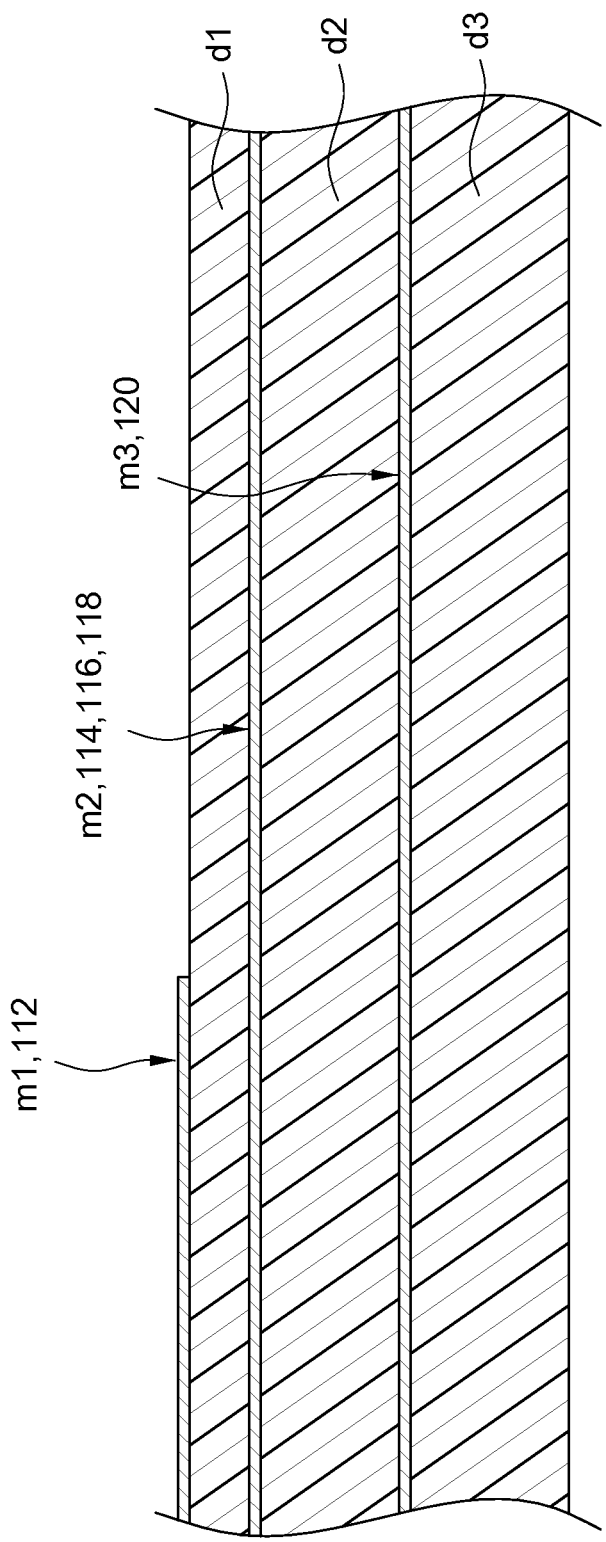
FIG. 9 shows a cross-sectional view of the related art embedded series fed patch array antenna structure.

In the following embodiment, the present disclosure introduces the floating patches 1062 into the design of the embedded series fed patch array antenna. Because the design of the series fed patch array antenna is simple and the series fed patch array antenna is easy to manufacture and integrate, the series fed patch array antenna is widely used in a lot of millimeter wave antenna modules. FIG. 8 shows a top view of the related art embedded series fed patch array antenna structure, wherein the dielectric layers and the side ground plane are not shown in FIG. 8. FIG. 9 shows a cross-sectional view of the related art embedded series fed patch array antenna structure.

As shown in FIG. 9, an upper ground plane 112 is arranged in a first metal layer m1. A side ground plane 114, an antenna body 116, and a transmission line 118 are arranged in a second metal layer m2. A lower ground plane 120 is arranged in a third metal layer m3. The related art series fed patch array antenna (namely, the antenna body 116) is embedded under the first dielectric layer d1 to solve the problem that the surface coating of the printed circuit board is easily oxidized. In order to have a larger visual range in the horizontal section, the related art series fed patch array antenna has a large clearance/blank area.

However, after the related art series fed patch array antenna is embedded in the printed circuit board, the radiation energy of the antenna propagates to the sides easily due to the environment formed by the first dielectric layer d1 and the second dielectric layer d2. Therefore, the antenna clearance/blank area needs to be handled more carefully. On the other hand, at least one of the first dielectric layer d1 and the second dielectric layer d2 is formed by the prepreg. Etching and removing a large area of the copper foil leads to incomplete filling of the resin and the formation of gaps, resulting in the risk of the blistering.

Figure 10:
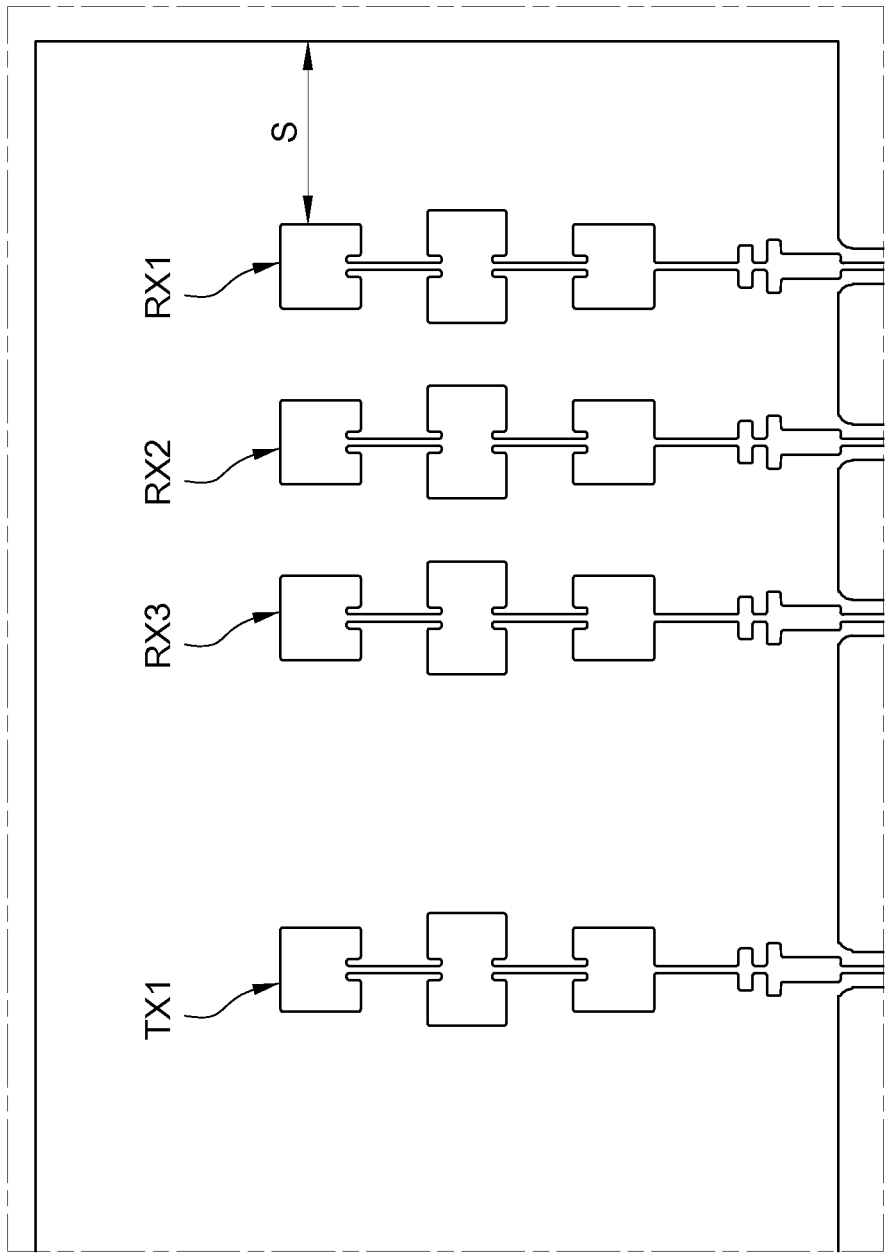
FIG. 10 shows a schematic diagram of the related art multi-transceiver embedded series fed patch array antenna in the second metal layer.

Introducing the aforementioned floating patches 1062 into the embedded series fed patch array antenna structure may effectively solve the problem of the clearance area. The following embodiment takes a multi-transceiver millimeter wave radar antenna module as an example. The operating frequency of the millimeter wave radar antenna module is 57 GHz to 61.5 GHz. For the highest operating frequency 61.5 GHz, the wavelength in vacuum is 4.87 mm. FIG. 10 shows a schematic diagram of the related art multi-transceiver embedded series fed patch array antenna in the second metal layer m2. As shown in FIG. 10, there are a first receiving antenna RX1, a second receiving antenna RX2, a third receiving antenna RX3, and a transmitting antenna TX1 from right to left. There is a larger spacing S (namely, a larger blank area) between each antenna, and between the antenna and the side ground plane on the same layer, which is detrimental to the machine characteristics of the multi-layer circuit board; for the embedded antenna design, there is further a risk of the blistering.

Figure 11:
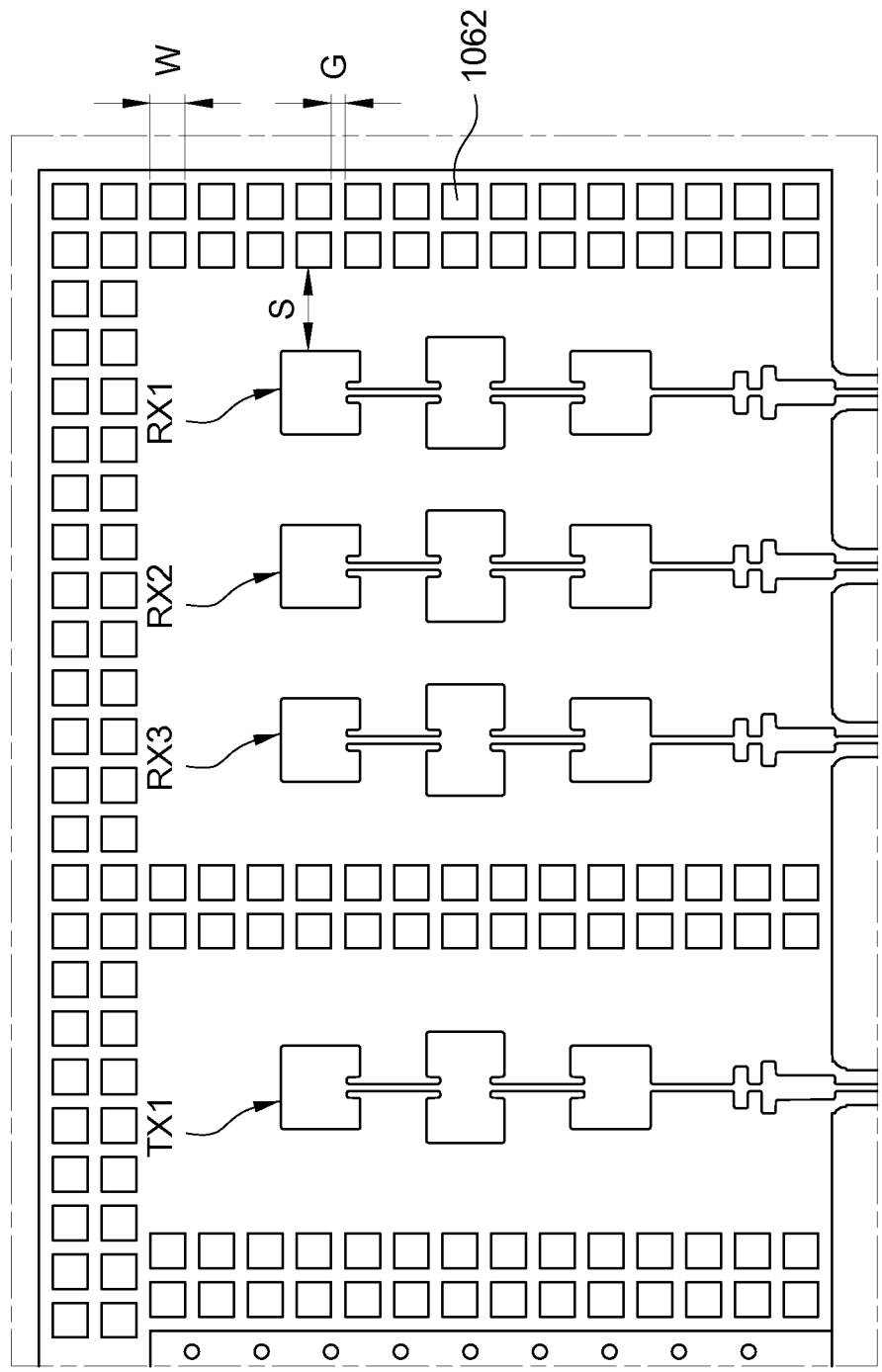
FIG. 11 shows a schematic diagram of the multi-transceiver embedded series fed patch array antenna of the present disclosure with the floating patches arranged in the second metal layer.

FIG. 11 shows a schematic diagram of the multi-transceiver embedded series fed patch array antenna of the present disclosure with the floating patches 1062 arranged in the second metal layer m2. As shown in FIG. 11, the floating patches 1062 are arranged around the series fed patch array antenna in the second metal layer to greatly increase the copper foil filling factor to avoid the risk of the blistering. The floating patches 1062 may also be arranged in the first metal layer to balance the copper foil filling factor of each metal layer to reduce the bending degree of the printed circuit board, and increase the heat dissipation effect. Introducing the floating patches 1062 into the related art non-embedded series fed patch array antenna (namely, the antenna is located in the first metal layer) may also reduce the bending degree of the printed circuit board, and may also increase the heat dissipation effect.

In the embodiment of FIG. 11, the width W of the floating patch 1062 is 0.5 mm, the gap G of the floating patches 1062 is 0.2 mm, and the width W of the floating patch 1062 is approximately 1/9.7 of the wavelength (slightly larger than the 1/10 criterion); because the size of the floating patch 1062 is larger, the spacing S between the floating patches 1062 and the antenna is designed to be slightly larger, about 1.0 mm, which is about 1/5 of the aforementioned wavelength 4.87 mm (namely, the spacing S is less than one-fifth of a wavelength corresponding to the operating frequency of the antenna 104 in a vacuum environment) to avoid having a drastic impact on the original field pattern of the antenna. Therefore, the filling factor of the floating patches 1062 is not very high.

Figure 13:
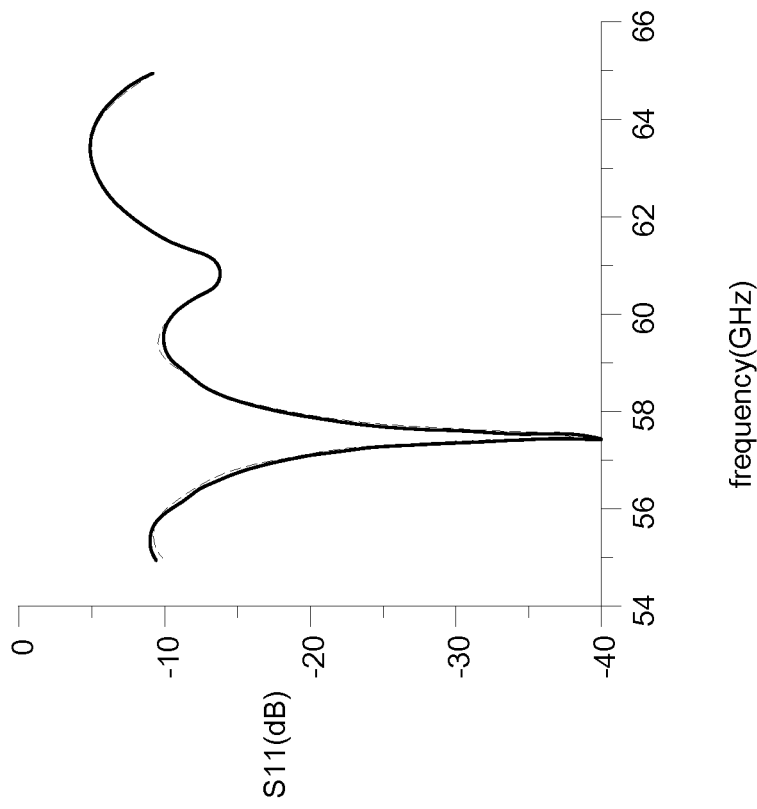
FIG. 13 shows a comparison diagram of S11 parameter of the second receiving antenna in FIG. 10 and FIG. 11.

FIG. 13 shows a comparison diagram of S11 parameter of the second receiving antenna RX2 in FIG. 10 and FIG. 11, wherein the dotted line is for FIG. 10 and the solid line is for FIG. 11. As shown in FIG. 13, the curve of the S11 parameter of the antenna characteristics of the related art multi-transceiver embedded series fed patch array antenna without arranging the floating patches 1062 is almost the same with the curve of the S11 parameter of the antenna characteristics of the multi-transceiver embedded series fed patch array antenna of the present disclosure with arranging the floating patches 1062 (namely, the difference is minimal).

Figure 14:
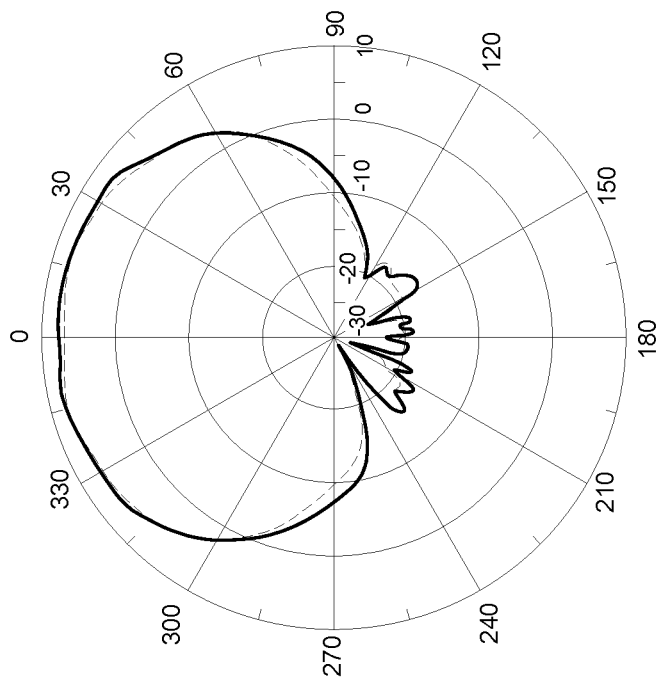
FIG. 14 shows a comparison diagram of the horizontal field pattern (at 57 GHz) of the second receiving antenna in FIG. 10 and FIG. 11.

FIG. 14 shows a comparison diagram of the horizontal field pattern (at 57 GHz) of the second receiving antenna RX2 in FIG. 10 and FIG. 11, wherein the dotted line is for FIG. 10 and the solid line is for FIG. 11. As shown in FIG. 14, the horizontal field pattern (at 57 GHz) of the related art multi-transceiver embedded series fed patch array antenna without arranging the floating patches 1062 is roughly the same with the horizontal field pattern (at 57 GHz) of the multi-transceiver embedded series fed patch array antenna of the present disclosure with arranging the floating patches 1062; there are only very small ripples in the ±45 degree range, and the side characteristics are slightly affected.

Figure 12:
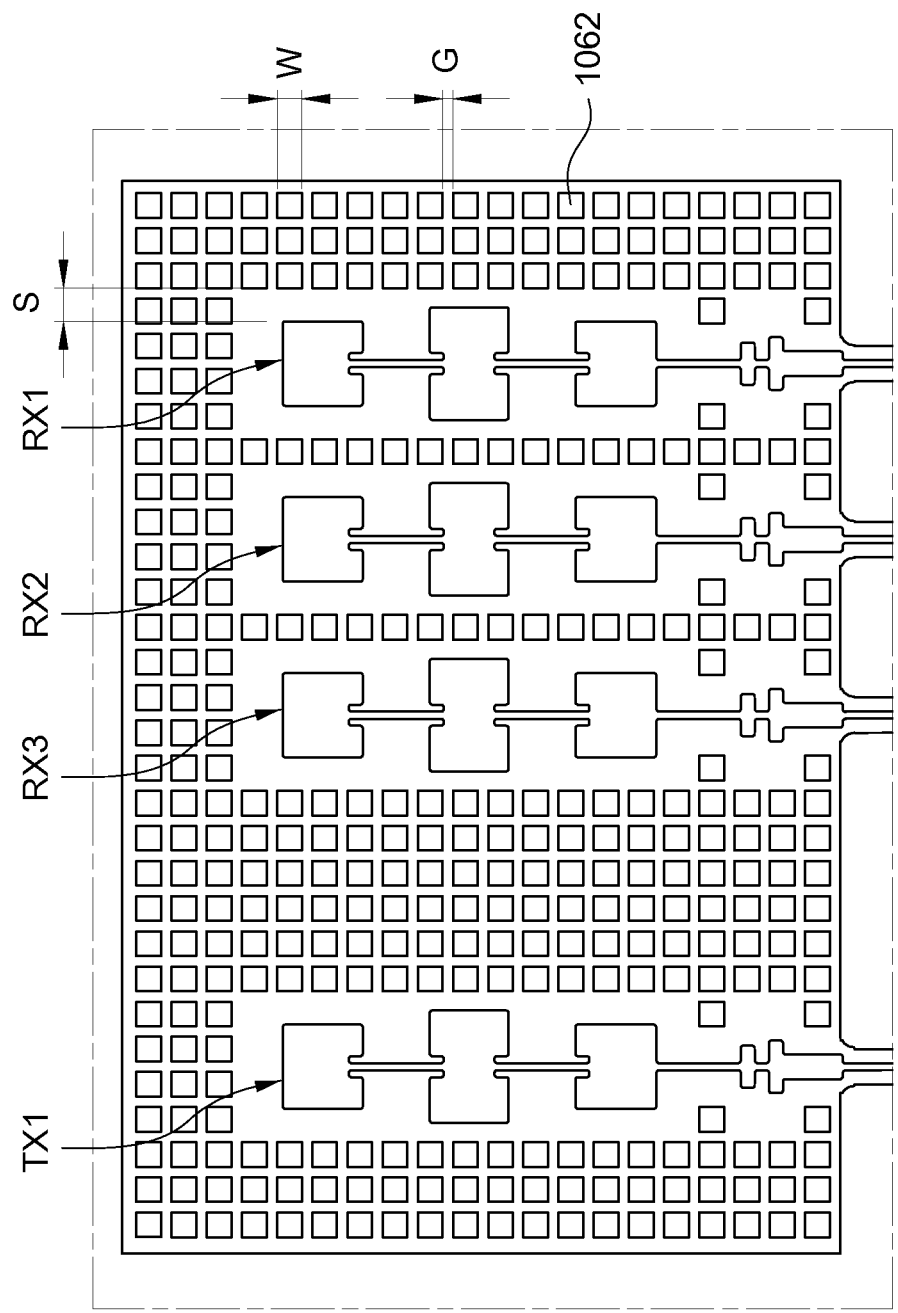
FIG. 12 shows a schematic diagram of another embodiment of the multi-transceiver embedded series fed patch array antenna of the present disclosure with the floating patches arranged in the second metal layer.

FIG. 12 shows a schematic diagram of another embodiment of the multi-transceiver embedded series fed patch array antenna of the present disclosure with the floating patches 1062 arranged in the second metal layer m2. FIG. 12 shows another arrangement of the floating patches 1062 for the structure of FIG. 10. In the embodiment of FIG. 12, the width W of the floating patch 1062 is 0.35 mm, the gap G of the floating patches 1062 is 0.15 mm, and the width W of the floating patch 1062 is approximately 1/13.9 of the wavelength (less than 1/10 criterion). Because the size of the floating patch 1062 is smaller, the spacing S between the floating patches 1062 and the antenna may be designed to be smaller without causing a drastic impact on the original field pattern of the antenna. The spacing S in this embodiment is 0.275 mm, which is approximately 1/18 of the aforementioned wavelength 4.87 mm; therefore, the filling factor of the floating patches 1062 may be higher than the filling factor of the floating patches 1062 in FIG. 11.

Figure 15:
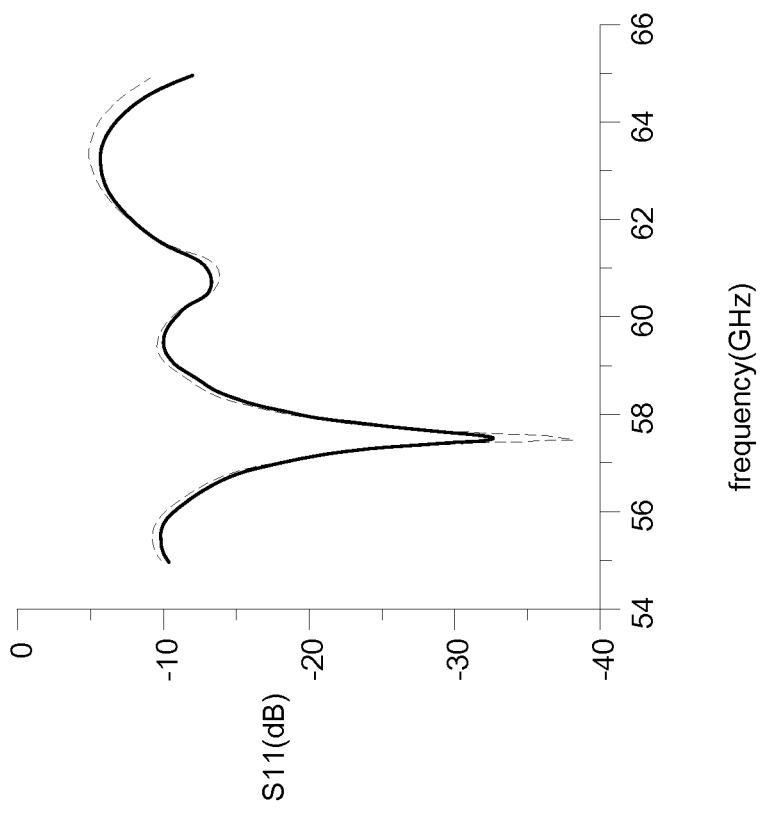
FIG. 15 shows a comparison diagram of S11 parameter of the second receiving antenna in FIG. 10 and FIG. 12.

FIG. 15 shows a comparison diagram of S11 parameter of the second receiving antenna RX2 in FIG. 10 and FIG. 12, wherein the dotted line is for FIG. 10 and the solid line is for FIG. 12. As shown in FIG. 15, the difference between the curve of the S11 parameter of the antenna characteristics of the related art multi-transceiver embedded series fed patch array antenna without arranging the floating patches 1062 and the curve of the S11 parameter of the antenna characteristics of the multi-transceiver embedded series fed patch array antenna of the present disclosure with arranging the floating patches 1062 is very small.

Figure 16:
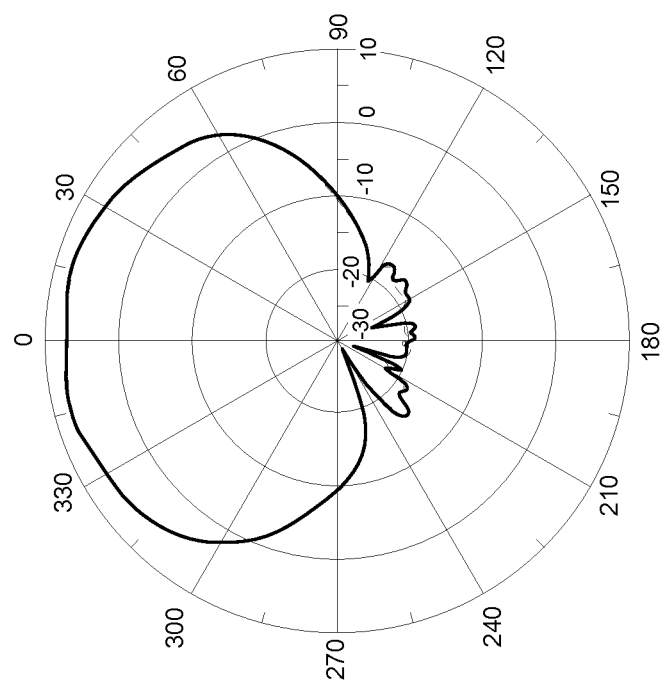
FIG. 16 shows a comparison diagram of the horizontal field pattern (at 57 GHz) of the second receiving antenna in FIG. 10 and FIG. 12.

FIG. 16 shows a comparison diagram of the horizontal field pattern (at 57 GHz) of the second receiving antenna RX2 in FIG. 10 and FIG. 12, wherein the dotted line is for FIG. 10 and the solid line is for FIG. 12. As shown in FIG. 16, the horizontal field pattern (at 57 GHz) of the related art multi-transceiver embedded series fed patch array antenna without arranging the floating patches 1062 is almost the same with the horizontal field pattern (at 57 GHz) of the multi-transceiver embedded series fed patch array antenna of the present disclosure with arranging the floating patches 1062. The arrangement of the floating patches 1062 almost has no impact on the field pattern at this frequency (57 GHz).

In summary, the present disclosure mainly arranges a plurality of small-area floating patches 1062 around the antenna 104 to replace the clearance area of the related art. The present disclosure mainly includes the following features:

1. The floating patches 1062 do not require through holes.

2. The floating patches 1062 may be respectively arranged in the metal layers in the multi-layer printed circuit board 102.

3. The present disclosure complies with the existing mainstream manufacturing processes and design specifications.

4. The floating patches 1062 may be laid close to the antenna 104 to greatly reduce the setback clearance area to increase the copper foil factor.

5. The present disclosure has only a very small and negligible impact on the antenna matching and the radiation field pattern.

6. The present disclosure may suppress the lateral propagation modes of the thick substrates and the multi-layer substrates.

The advantage of the present disclosure is to prevent the deformation, warping, and blistering of the multi-layer printed circuit board 102, and to improve the heat dissipation performance of the multi-layer printed circuit board 102.

Moreover, in an embodiment which does not limit the present disclosure, the floating patches 1062 are electrically isolated from each other and are not grounded and have no through holes. Please refer to FIG. 7 again. A part of the floating patches 1062 are arranged between the main patch 1044 and the parasitic patch 1046, and are located within a projection-connection range between a plurality of second edges E2 of the main patch 1044 and a plurality of first edges E1 of the parasitic patch 1046 (please refer to the dotted lines in FIG. 7). The floating patches 1062 in different layers may be arranged in a staggered manner.

Although the present disclosure has been described with reference to the embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure.

What is claimed is:

1. An antenna apparatus comprising:
    a multi-layer printed circuit board comprising a first metal layer, a first dielectric layer, a second metal layer, a second dielectric layer, and a third metal layer, wherein the first dielectric layer is arranged between the first metal layer and the second metal layer, and the second dielectric layer is arranged between the second metal layer and the third metal layer;
    an antenna located in the multi-layer printed circuit board and comprising an electromagnetic resonance structure, wherein the antenna is formed from at least one of the first metal layer, the second metal layer, and the third metal layer, and the antenna has an operating frequency; and
    a floating patch group located in the multi-layer printed circuit board and comprising a plurality of floating patches, wherein the floating patch has a width, and there is a gap between the floating patch and an adjacent floating patch, and the floating patches have same or similar width and same or similar gap, and the floating patch group is arranged in a metal layer where the antenna is located, and there is a spacing between the floating patch group and the antenna on a plane.

2. The antenna apparatus of claim 1, wherein the antenna is a series fed patch array antenna.

3. The antenna apparatus of claim 1, wherein the electromagnetic resonance structure comprises a main patch and a parasitic patch; the main patch is formed from the first metal layer, the second metal layer, or the third metal layer; the parasitic patch is formed from the first metal layer, the second metal layer, or the third metal layer; the main patch and the parasitic patch are separated by at least one of the first dielectric layer and the second dielectric layer; the floating patch group is arranged in the metal layer where the main patch and the parasitic patch are located.

4. The antenna apparatus of claim 3, wherein the parasitic patch is located in the first metal layer; the main patch is located in the third metal layer; the floating patch group is arranged in the first metal layer, the second metal layer, and the third metal layer.

5. The antenna apparatus of claim 1, wherein the width of the floating patch is less than one-eighth of a wavelength corresponding to the operating frequency of the antenna in a vacuum environment.

6. The antenna apparatus of claim 1, wherein the spacing is less than one-fifth of a wavelength corresponding to the operating frequency of the antenna in a vacuum environment.

* * * * *